(12) United States Patent
Yoon et al.

(10) Patent No.: US 12,154,935 B2
(45) Date of Patent: Nov. 26, 2024

(54) DISPLAY DEVICE USING SEMICONDUCTOR LIGHT EMITTING ELEMENT AND BLACK DYE LAYERS

(71) Applicant: LG ELECTRONICS INC., Seoul (KR)

(72) Inventors: Dongjin Yoon, Seoul (KR); Jeongsik Choi, Seoul (KR); Sangtae Park, Seoul (KR); Inbeom Ha, Seoul (KR); Kiseok Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 238 days.

(21) Appl. No.: 17/412,719

(22) Filed: Aug. 26, 2021

(65) Prior Publication Data

US 2022/0069002 A1 Mar. 3, 2022

(30) Foreign Application Priority Data

Aug. 27, 2020 (KR) .......... 10-2020-0108693

(51) Int. Cl.
*H10K 50/84* (2023.01)
*G09F 9/30* (2006.01)
(Continued)

(52) U.S. Cl.
CPC ............ *H01L 27/156* (2013.01); *G09F 9/301* (2013.01); *H01L 33/44* (2013.01); *H10K 50/841* (2023.02); *H10K 50/844* (2023.02); *H10K 50/865* (2023.02); *F21K 9/64* (2016.08); *G02F 1/133305* (2013.01); *G06F 1/1652* (2013.01);
(Continued)

(58) Field of Classification Search
CPC ....... H01L 27/156; H01L 33/44; H01L 33/52; H01L 33/58; H01L 33/62; H01L 25/167; H01L 25/0753; H10K 50/841; H10K 50/844; H10K 50/865; H10K 50/8426; H10K 50/115; H10K 59/124; H10K 59/1221; H10K 59/19; H10K 59/18; H10K 59/35; H10K 77/111; H10K 2102/311; F21K 9/64; G02B 1/11; G02B 5/208; G02F 1/133305; G06F 1/1652; G09F 9/301; G09G 2380/02
See application file for complete search history.

(56) References Cited

U.S. PATENT DOCUMENTS 4,795,243 A * 1/1989 Suzuki ................. G02B 26/004
359/291
2006/0099333 A1* 5/2006 Cheong .................... G02B 5/00
427/162

(Continued)

FOREIGN PATENT DOCUMENTS

WO WO-2020145148 A1 * 7/2020 .......... H01L 27/322

*Primary Examiner* — Ida M Soward
(74) *Attorney, Agent, or Firm* — Birch, Stewart, Kolasch & Birch, LLP

(57) ABSTRACT

Disclosed is a display device including a base substrate including a circuit wiring, a semiconductor light emitting element connected to the circuit wiring and emitting light in response to an applied voltage, an envelope layer sealing the semiconductor light emitting element, a transparent protective film stacked on the envelope layer and having flexibility, and a black dye layer coated on the transparent protective film and having a preset transmissivity.

20 Claims, 19 Drawing Sheets

(51) Int. Cl.
    *H01L 27/15*     (2006.01)
    *H01L 33/44*     (2010.01)
    *H10K 50/844*     (2023.01)
    *H10K 50/86*     (2023.01)
    *H10K 59/12*     (2023.01)
    *F21K 9/64*     (2016.01)
    *G02F 1/1333*     (2006.01)
    *G06F 1/16*     (2006.01)
    *H10K 50/115*     (2023.01)
    *H10K 50/842*     (2023.01)
    *H10K 59/10*     (2023.01)
    *H10K 59/122*     (2023.01)
    *H10K 59/124*     (2023.01)
    *H10K 59/18*     (2023.01)
    *H10K 59/19*     (2023.01)
    *H10K 59/35*     (2023.01)
    *H10K 77/10*     (2023.01)
    *H10K 102/00*     (2023.01)

(52) U.S. Cl.
    CPC ....... *G09G 2380/02* (2013.01); *H10K 50/115* (2023.02); *H10K 50/8426* (2023.02); *H10K 59/10* (2023.02); *H10K 59/122* (2023.02); *H10K 59/124* (2023.02); *H10K 59/18* (2023.02); *H10K 59/19* (2023.02); *H10K 59/35* (2023.02); *H10K 77/111* (2023.02); *H10K 2102/311* (2023.02)

(56) References Cited

U.S. PATENT DOCUMENTS

| | | | |
|---|---|---|---|
| 2006/0154092 A1* | 7/2006 | Naito | G02B 5/208 428/457 |
| 2012/0032151 A1* | 2/2012 | Hama | H10K 50/13 252/586 |
| 2013/0242372 A1* | 9/2013 | Park | B05D 1/26 359/290 |
| 2015/0188091 A1* | 7/2015 | Kudo | G06F 30/00 703/1 |
| 2015/0277633 A1* | 10/2015 | Jiang | G02F 1/133512 345/174 |
| 2016/0322444 A1* | 11/2016 | Kang | H10K 50/865 |
| 2017/0062674 A1* | 3/2017 | Kwon | H01L 25/0753 |
| 2018/0061894 A1* | 3/2018 | Kim | H10K 50/865 |
| 2018/0145115 A1* | 5/2018 | Shimizu | H10K 59/122 |
| 2018/0175115 A1* | 6/2018 | Choi | H10K 59/351 |
| 2018/0331326 A1* | 11/2018 | Woo | H10K 59/40 |
| 2019/0235330 A1* | 8/2019 | Park | G02F 1/1368 |
| 2019/0245017 A1* | 8/2019 | Jeon | H10K 59/126 |
| 2019/0341428 A1* | 11/2019 | Lee | H10K 50/8445 |
| 2020/0006387 A1* | 1/2020 | Moon | H01L 27/124 |
| 2020/0052058 A1* | 2/2020 | Lee | H10K 50/865 |
| 2020/0295310 A1* | 9/2020 | Moon | H10K 59/1315 |
| 2021/0066643 A1* | 3/2021 | Choi | H10K 50/822 |

* cited by examiner

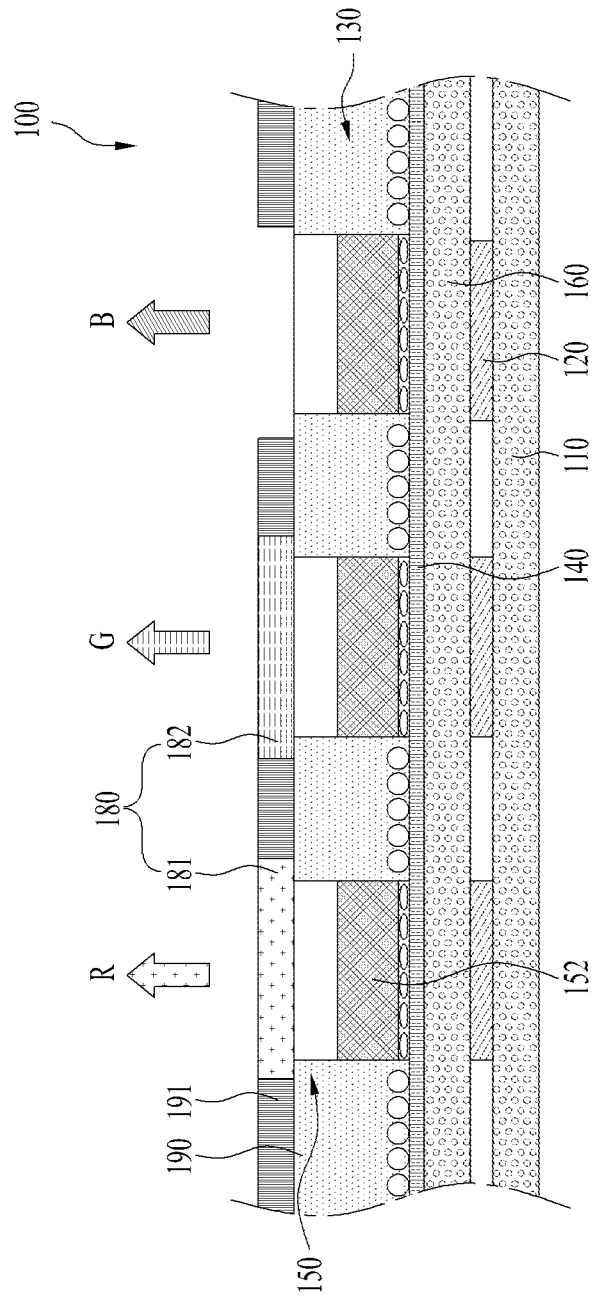

FIG. 13

| Time | ΔYI | ΔE |
|---|---|---|
| 0h | - | - |
| 24h | 0.77 | 0.44 |
| 48h | 1.38 | 0.66 |

(a)

| Time | ΔYI | ΔE |
|---|---|---|
| 0h | - | - |
| 24h | 0.77 | 0.44 |
| 48h | 0.75 | 0.43 |

(b)

DISPLAY DEVICE USING SEMICONDUCTOR LIGHT EMITTING ELEMENT AND BLACK DYE LAYERS

Pursuant to 35 U.S.C. § 119(a), this application claims the benefit of earlier filing date and right of priority to Korean Application No. 10-2020-0108693, filed on Aug. 27, 2020, the contents of which are hereby incorporated by reference herein in their entirety.

BACKGROUND OF THE DISCLOSURE

Field of the Disclosure

The present disclosure relates to a display device using a semiconductor light emitting element, and more particularly, to a technology of a Colorless Polyimide (CPI) film included in a display device using a semiconductor light emitting element.

Discussion of the Related Art

Light Emitting Diode (LED) is a semiconductor light emitting element well known for converting current into light, and has been used as a display image light source for electronic devices including information communication devices together with GaP:N series of green LED, starting in 1962 with a commercialization of red LED using GaAsP compound semiconductors. Compared to a filament-based light-emitting device, the semiconductor light emitting element has various advantages such as long life, low power consumption, excellent initial driving characteristics, high vibration resistance, etc.

Here, a semiconductor light emitting element may include at least one of a mini LED and a micro LED. Although there is no exact definition of size, a micro LED may be an LED having a size between several and tens of micrometers, and a mini LED may be an LED having a size tens of times greater than that of the micro LED.

A display device that uses semiconductor light emitting elements may be thinned and have advantages in implementing various types of display devices. For example, it may be advantageous for implementing a curved or flexible display device.

For the implementation of display devices of various types or a flexible display device, a protective film protecting a semiconductor light emitting element may need flexibility as well. To this end, Transparent Polyimide (CPI) has recently been used as a protective film instead of glass. However, when transparent polyimide (CPI) is exposed to UltraViolet (UV) rays for a long time, there is a problem of a yellowness effect.

SUMMARY OF THE DISCLOSURE

Accordingly, embodiments of the present disclosure are directed to a display device using a semiconductor light emitting element that substantially obviates one or more problems due to limitations and disadvantages of the related art.

One object of the present disclosure is to provide a display device using a semiconductor light emitting element.

Another object of the present disclosure is to reduce a yellowness effect of a protective film that protects a semiconductor light emitting element.

Further object of the present disclosure is to reduce a yellowness difference of a protective film between display modules in a module-type display device.

Additional advantages, objects, and features of the disclosure will be set forth in the disclosure herein as well as the accompanying drawings. Such aspects may also be appreciated by those skilled in the art based on the disclosure herein.

To achieve these objects and other advantages and in accordance with the purpose of the disclosure, as embodied and broadly described herein, a display device using a semiconductor light emitting element according to one embodiment of the present disclosure may include a base substrate including a circuit wiring, a semiconductor light emitting element connected to the circuit wiring and emitting light in response to an applied voltage, an envelope layer sealing the semiconductor light emitting element, a transparent protective film stacked on the envelope layer and having flexibility, and a black dye layer coated on the transparent protective film and having a preset transmissivity.

The transparent protective film may include a Colorless Polyimide (CPI) film.

The black dye layer may include a UV shield agent.

The black dye layer may have transmissivity of 30%.

The display device may further include a black dye layer additionally coated on a backside of the transparent protective film.

The black dye layer coated on a front side of the transparent protective film may have transmissivity lower than that of the black dye layer coated on the backside of the transparent protective film.

The display device may include at least one of an Anti-Reflection (AR) or Anti-Glare (AG) film, a Low Reflection (LR) film, or an Anti-Finger (AF) film on the black dye layer.

In another aspect of the present disclosure, as embodied and broadly described herein, a display device using a semiconductor light emitting element according to another embodiment of the present disclosure may include a frame and a plurality of display modules arranged in the frame, each of the display modules, including a base substrate including a circuit wiring, a semiconductor light emitting element connected to the circuit wiring and emitting light in response to an applied voltage, an envelope layer sealing the semiconductor light emitting element, a transparent protective film stacked on the envelope layer and having flexibility, and a black dye layer coated on the transparent protective film and configured to have a preset transmissivity and maintain a yellowness index of the transparent protective film between the adjacent display modules within a preset range.

The transparent protective film may include a Colorless Polyimide (CPI) film.

The black dye layer may include a UV shield agent.

The black dye layer may maintain the yellowness index of the transparent protective film between the display module exposed to UV rays over a preset time and the display module newly manufactured within the preset range.

The black dye layer may have transmissivity of 30%.

The display device may further include a black dye layer additionally coated on a backside of the transparent protective film.

The black dye layer coated on a front side of the transparent protective film may have transmissivity lower than that of the black dye layer coated on the backside of the transparent protective film.

The display module may include at least one of an Anti-Reflection (AR) or Anti-Glare (AG) film, a Low Reflection (LR) film, or an Anti-Finger (AF) film on the black dye layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The present invention will become more fully understood from the detailed description given herein below and the accompanying drawings, which are given by illustration only, and thus are not limitative of the present invention, and wherein:

FIGS. 3A and 3B are cross-sectional diagrams taken along the cutting lines B-B and C-C in FIG. 2;

FIG. 13 shows data of transparency reduction improvement of a transparent protective film after a preset time according to one embodiment;

DETAILED DESCRIPTION OF THE DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
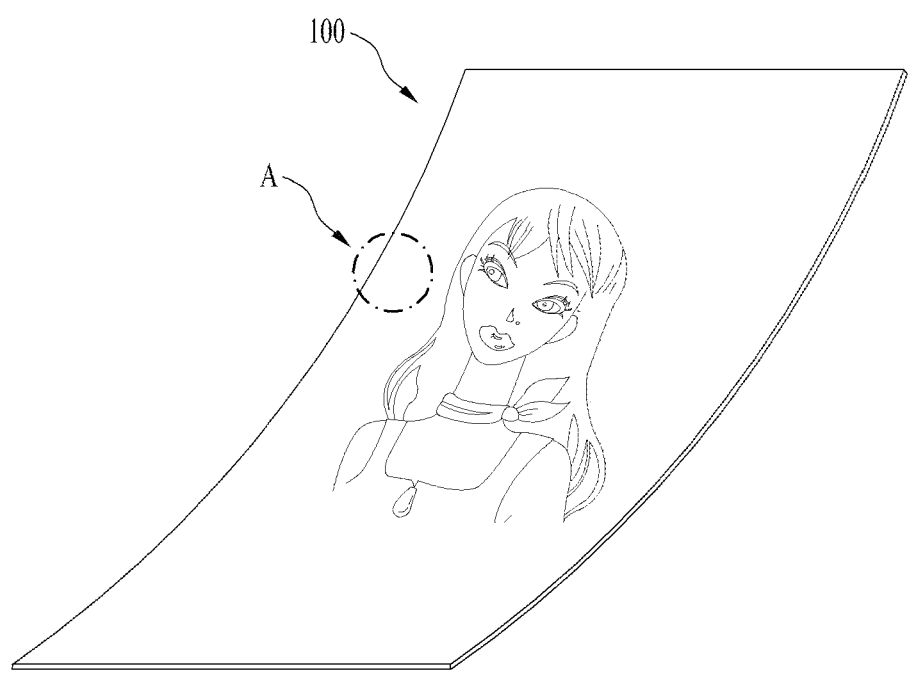
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface.

As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
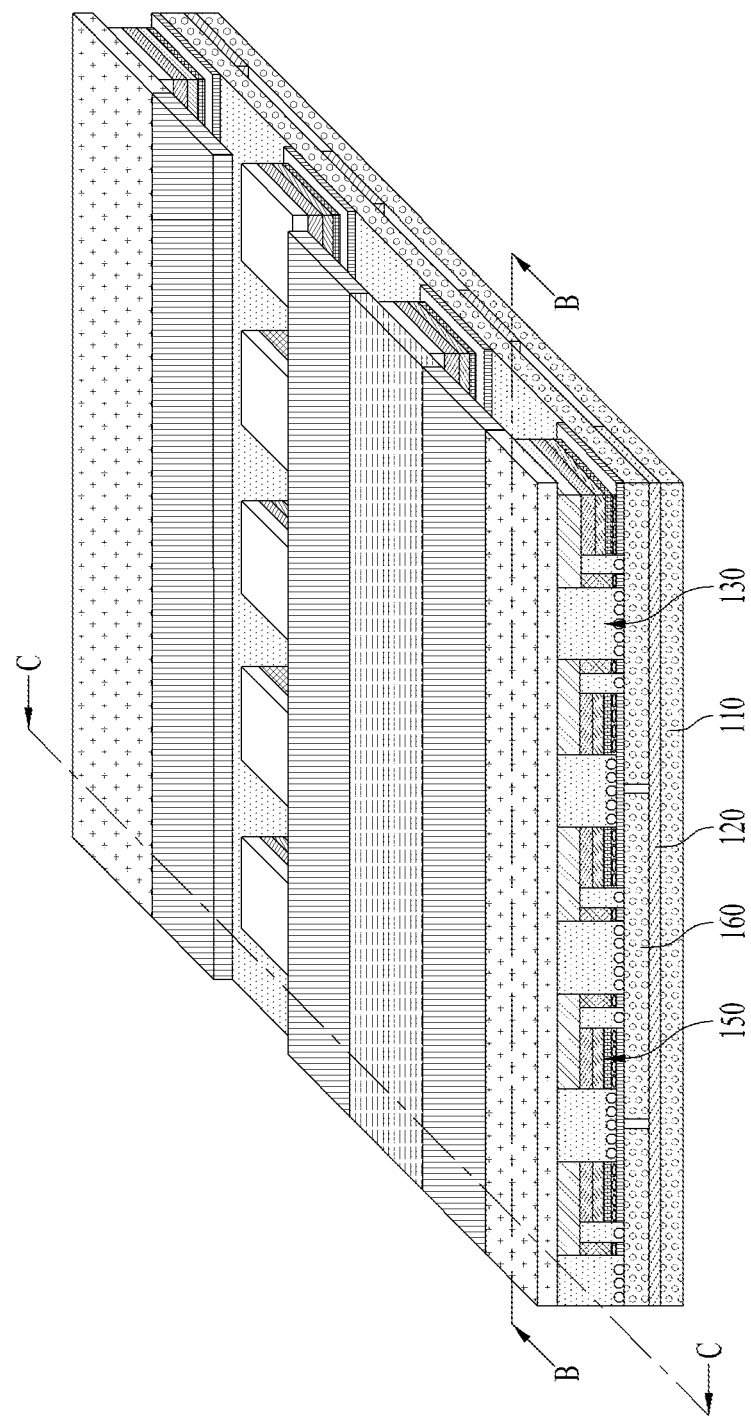
FIG. 2 is a partially enlarged diagram showing a part A shown in FIG. 1.

FIG. 2 is a partially enlarged view showing part A of FIG. 1.

Figure 3A:
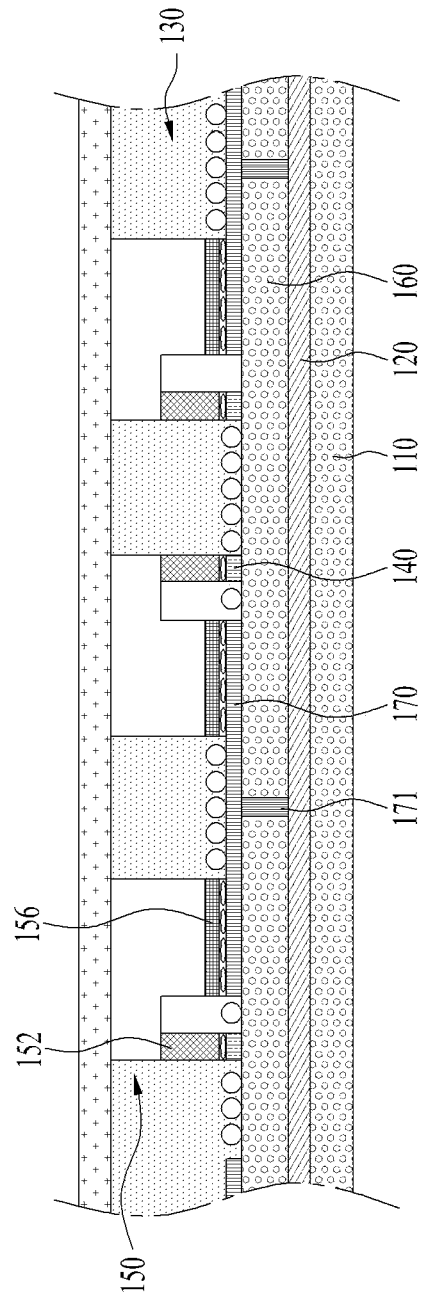

FIGS. 3A and 3B are cross-sectional views taken along lines B-B and C-C in FIG. 2.

Figure 4:
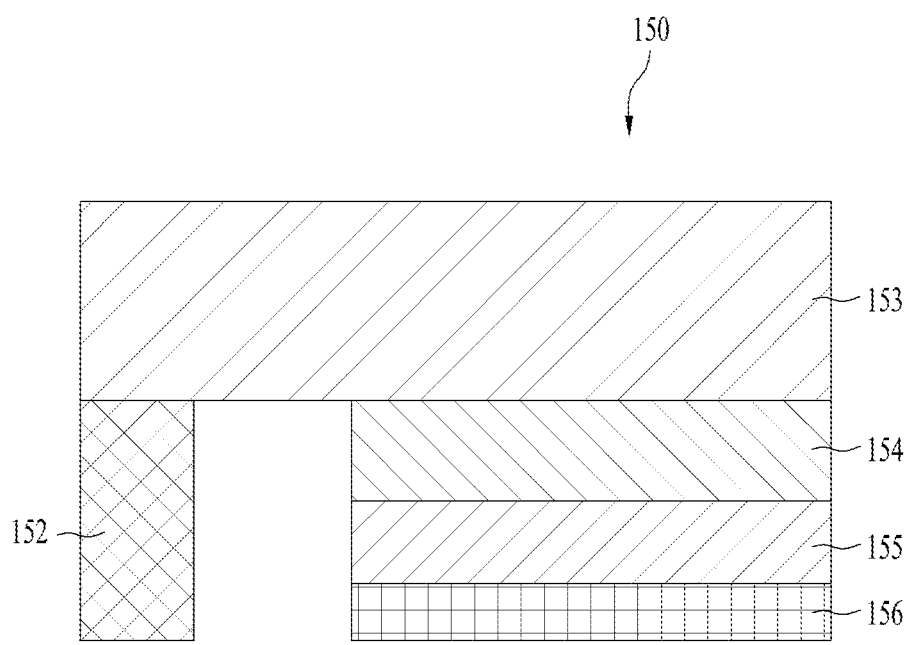
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
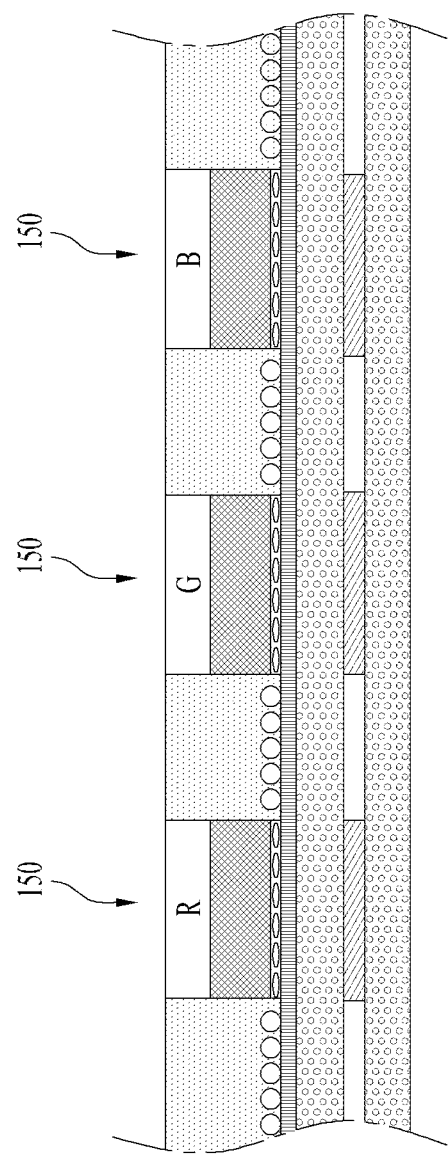
FIGS. 5A to 5C are conceptual diagrams illustrating various examples of color implementation with respect to a flip-chip type semiconductor light emitting element.
Figure 5B:
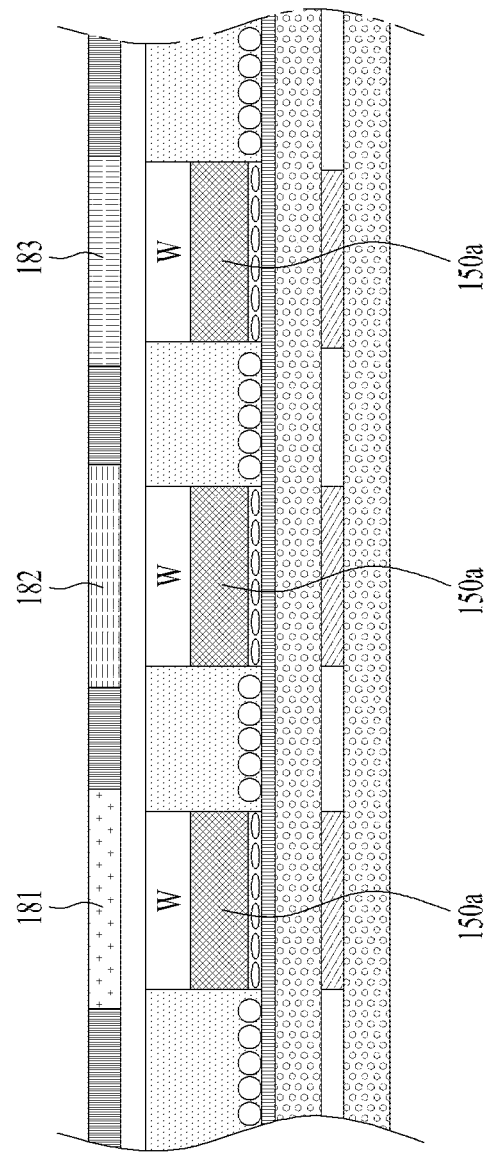
Figure 5C:
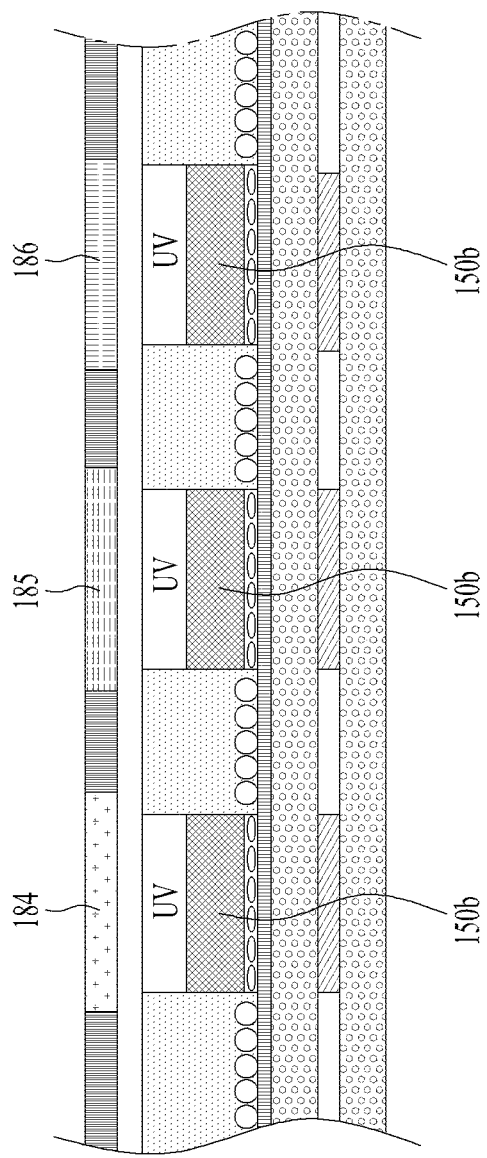

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 μm or less, and the device may have a rectangular or square shape. When the semiconductor light emitting element has a rectangular shape, the size thereof may be less than or equal to 20 μm×80 μm.

In addition, even when a square semiconductor light emitting element having a side length of 10 μm is used as a unit pixel, sufficient brightness to form a display device may be obtained.

Therefore, for example, in case of a rectangular pixel having a unit pixel size of 600 μm×300 μm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
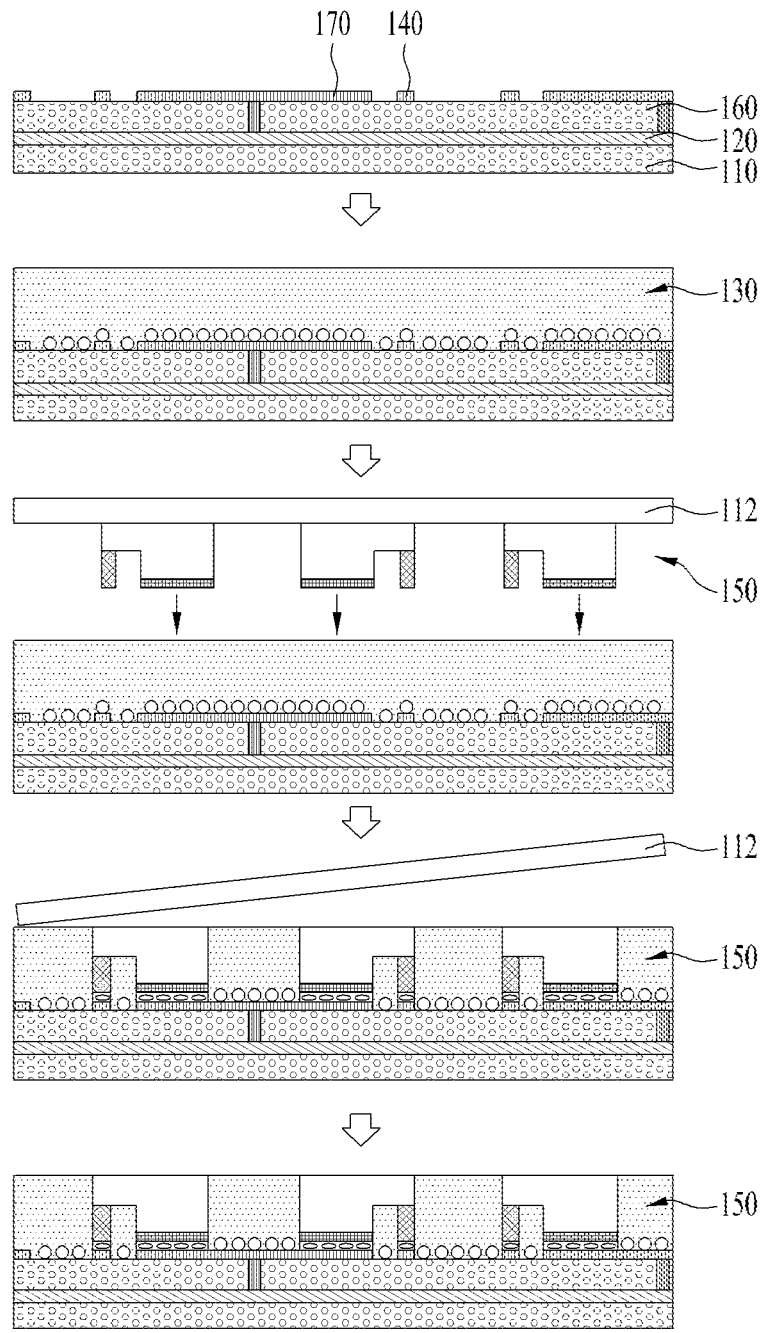
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide ($SiO_x$) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
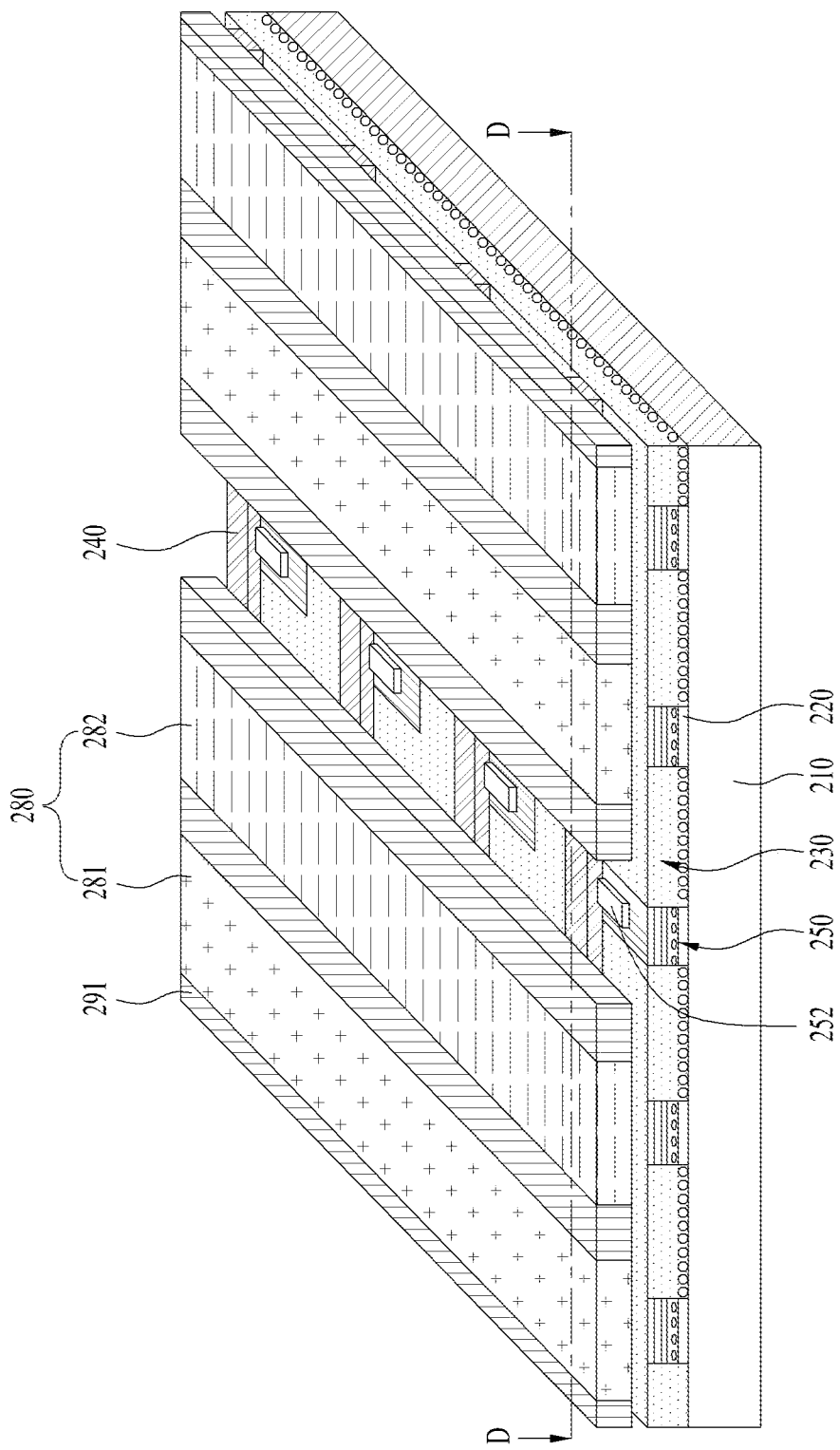
FIG. 7 is a perspective diagram of a display device using a semiconductor light emitting element according to another embodiment of the present disclosure.
Figure 8:
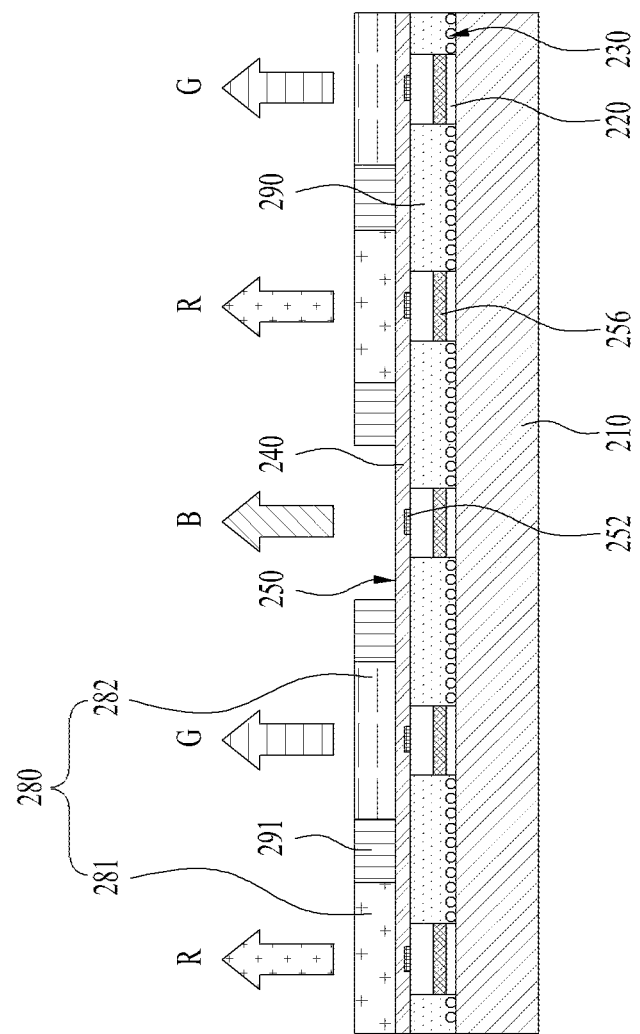
FIG. 8 is a cross-sectional diagram taken along a cutting line D-D shown in FIG. 8.
Figure 9:
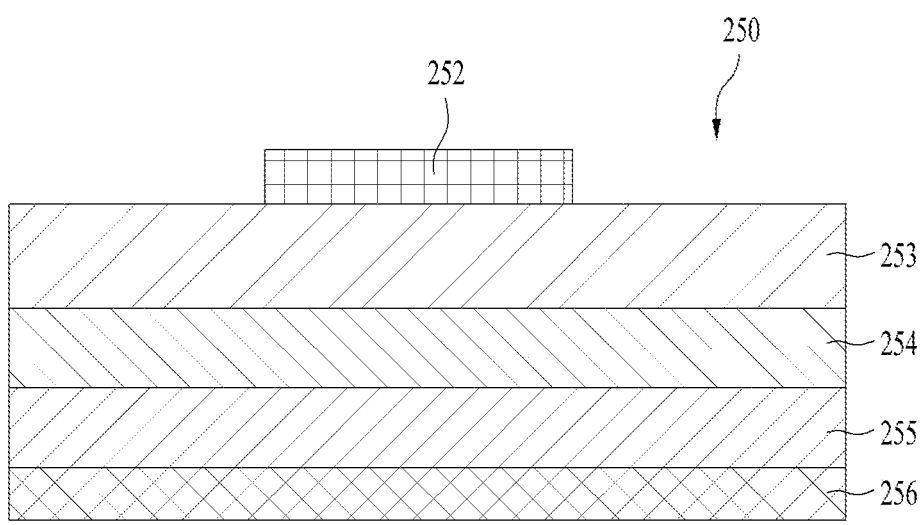
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide ($SiO_x$) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
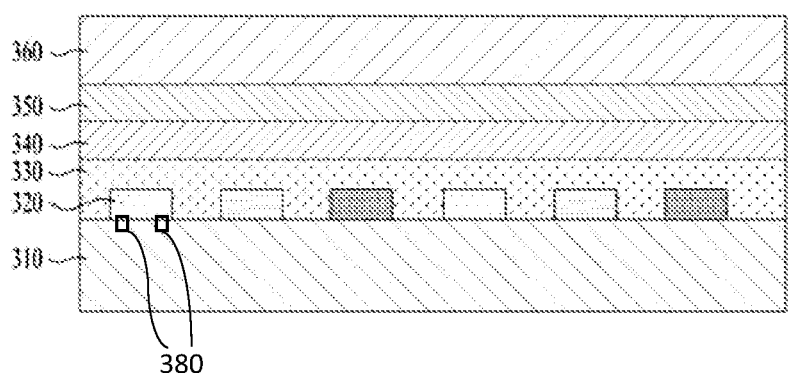
FIG. 10 is a conceptual diagram to describe a stacked structure of a display device using a semiconductor of the related art.
Figure 11:
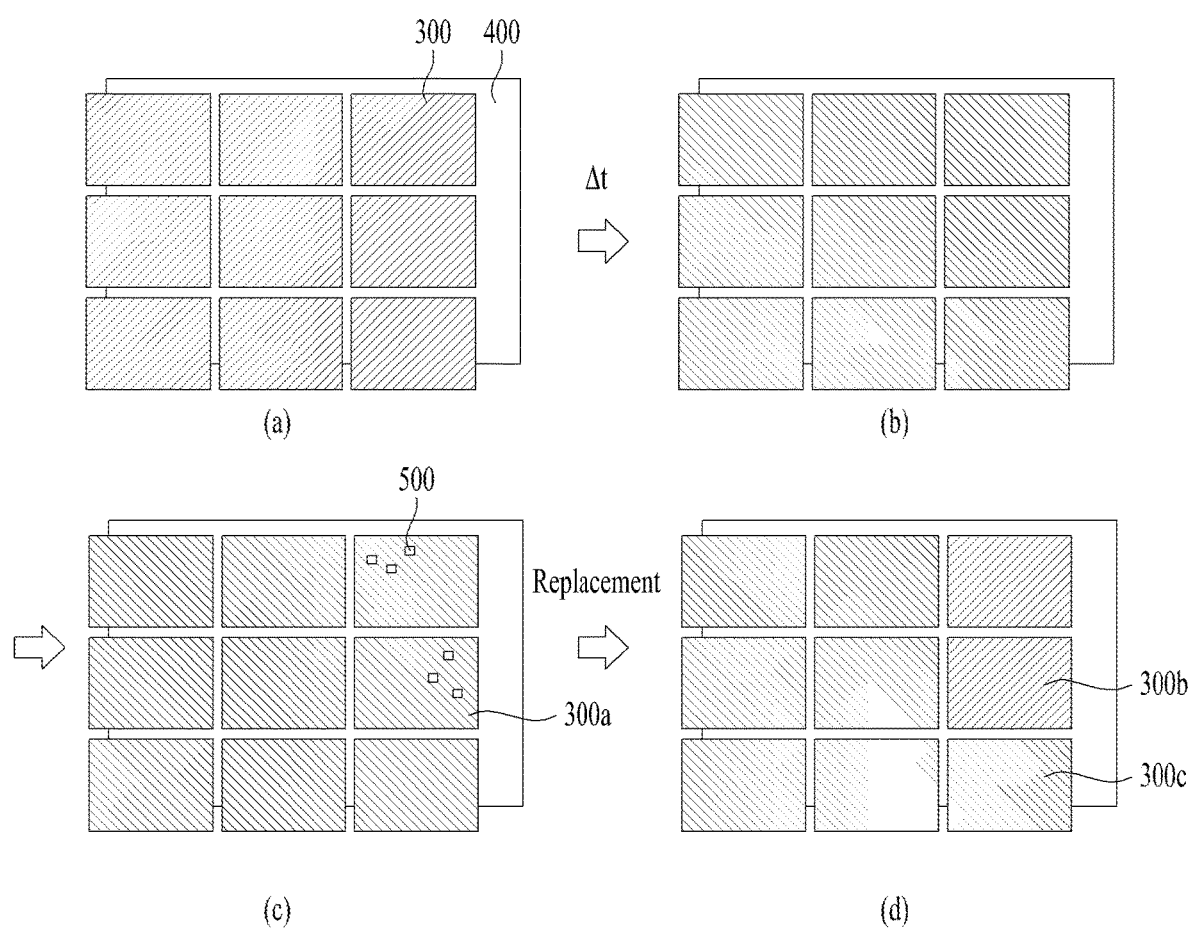
FIG. 11 is a conceptual diagram to describe a module structure of a display device using a semiconductor of the related art and problems thereof.

FIG. 10 is a conceptual diagram to describe a stacked structure of a display device using a semiconductor of the related art. FIG. 11 is a conceptual diagram to describe a module structure of a display device using a semiconductor of the related art and problems thereof.

A display device using semiconductor may include a base substrate 310, a semiconductor light emitting element 320 connected to a circuit board and emitting light in response to an applied voltage, an envelope layer 330 sealing the semiconductor light emitting element, and a transparent protective film 360 stacked on the envelope layer 330 and having flexibility.

The base substrate 310 may have flexibility with the configuration corresponding to the substrate 110 described with reference to FIG. 2 and include the circuit wiring and electrode unit for applying voltage to eh semiconductor light emitting element 320.

The semiconductor light emitting element 320 may include a micro LED in size of tens to hundreds micrometers. A detailed example of the semiconductor light emitting element 320 may refer to FIG. 4 or FIG. 9. In some cases, the semiconductor light emitting element 320 may include a mini LED having a size tens of times greater than the micro LED. Here, the mini LED may differ from the micro LED in a stacked structure as well as the size. Particularly, the mini LED may further include a growing substrate configured to grow a semiconductor layer.

The envelope layer 330 may provide a function of shielding the semiconductor light emitting element 320 from external moisture or air. The envelope layer 330 may be configured in a stacked structure of an organic layer and an inorganic layer. Particularly, the envelope layer 330 may include a structure that an organic layer and an inorganic layer are alternately formed. The inorganic layer has the excellent property of blocking the penetration of moisture and air so as to be suitable for being used as an envelope. Yet, particles (e.g., small dust) exist due to the material property and cause a sort of holes (referred to as pinholes), thereby causing a problem that air and moisture may penetrate through such a path. The organic layer is a substance having a sparse inside basically and may play a role in performing planarization by enclosing the particles on the stacked inorganic layer and then helping the formation of a next inorganic layer rather than preventing penetration.

The transparent protective film 360 has flexibility and may prevent the semiconductor light emitting element 320 from being broken by external shock or impact. Glass used to be used as a protective film. Recently, to meet the needs for display devices of various types, the transparent protective film 360 is used. As a representative example of the transparent protective film 360, a colorless polyimide (CPI) film may be used.

The transparent protective film 360 may be bonded to the envelope layer 330 using an adhesive layer 340.

In a conventional display device using a semiconductor, a black dye layer 350 is coated on a backside of the transparent protective film 360 to increase a contrast range of a screen. In some cases, the black dye layer 350 is coated on a top surface of the envelope layer 330. Here, the black dye may include a colored dye in black as a dye having preset transmissivity.

The transparent protective film 360 may use substances with strong physical properties such as chemical resistance and wear resistance. A film with these physical properties may be a transparent polyimide (CPI) film. Transparency may be important for the transparent protective film 360 in addition to the physical properties. Therefore, it may be important to transparently manage the transparent protective film 360. In particular, the disadvantage of the polyimide (PI) films is that they have weak yellow color. A polyimide (PI) film from which such a yellow component is removed is a Colorless PolyImide (CPI) film. The colorless polyimide (CPI) film manages a yellow component by placing a yellowness index as a single item.

The transparency management of the transparent protective film 360 may be more important for a large-screen display device that uses a display module. Regarding this, FIG. 11 will be referred to.

A display device using a display module may include a frame 400 and a plurality of display modules 300 arranged in the frame 400.

The display modules 300 may configure a large screen in a manner of forming a grid array in the frame 400. Each of the display modules 300 may be a unit module having the stacked structure of FIG. 10. Particularly, the display module 300 may include a base substrate 310 including a circuit wiring 380, a semiconductor light emitting element 320 electrically connected to the circuit wiring and emitting light in response to an applied voltage, an envelope layer 330 sealing the semiconductor light emitting element 320, and a transparent protective film 360 stacked on the envelope layer 330 and having flexibility.

In the display device using the display modules 300, the transparency of the transparent protective film 360 included in each of the display modules 300 may be reduced after the lapse of time. In case that the transparent protective film 360 is exposed to UV rays for a long time, transparency may be reduced. Particularly, FIG. 11(b) shows an example that the transparency of the transparent protective film 360 is reduced after the lapse of a preset time Δt. Here, in case that Colorless PolyImide (CPI) is used as the transparent protective film 360, the transparent protective film 360 may show yellow color due to UV exposure after the lapse of the preset time Δt. In a state that the transparency of the transparent protective film 360 is reduced, if an error 500 occurs in the semiconductor light emitting element, the corresponding display module 300a needs to be replaced entirely [see FIG. 11(c) and FIG. 11(d)]. In this case, it may cause a problem that the replaced display module 300b and the display module 300c in the assembled state before the replacement may differ from each other in transparency. If the display modules 300 configuring a single large screen differs from each other in transparency of the transparent protective film 360, it may cause a problem that it is unable to implement a single screen connected seamlessly.

To solve the above problems, a coated surface of the black dye layer 350 may be changed. A stacked structure of the display device in which a coated surface of the black dye layer 350 is changed will be described as follows.

Figure 12:
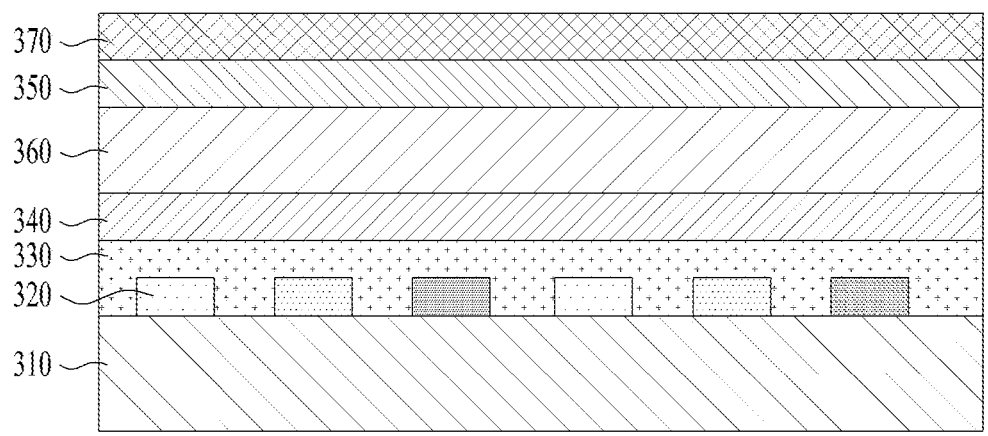
FIG. 12 is a conceptual diagram to describe a stacked structure of a display device using a semiconductor according to one embodiment to prevent a transparency reduction effect of a transparent protective film.
Figure 14:
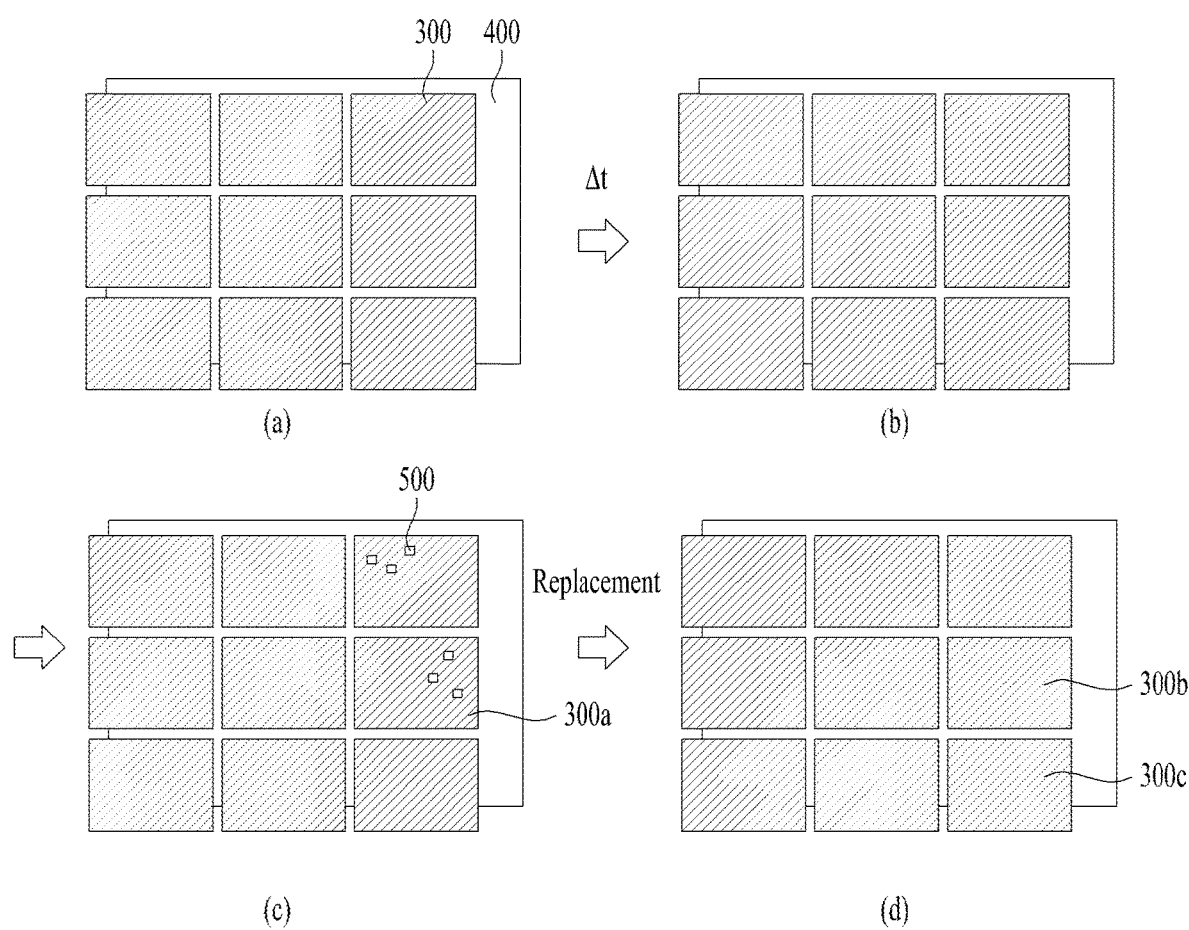
FIG. 14 is a conceptual diagram to describe a module structure of a display device using a semiconductor according to one embodiment, a transparency reduction effect of which is improved.

FIG. 12 is a conceptual diagram to describe a stacked structure of a display device using a semiconductor according to one embodiment to prevent a transparency reduction effect of a transparent protective film. FIG. 13 shows data of transparency reduction improvement of a transparent protective film after a preset time according to one embodiment. FIG. 14 is a conceptual diagram to describe a module structure of a display device using a semiconductor according to one embodiment, a transparency reduction effect of which is improved. The description of the same configuration will refer to FIG. 10.

According to one embodiment, a display device using a semiconductor may include a base substrate 310 including a circuit wiring, a semiconductor light emitting element 320 connected to a circuit board and emitting light in response to an applied voltage, an envelope layer 330 sealing the semiconductor light emitting element 320, a transparent protective film 360 stacked on the envelope layer 330 and having flexibility, and a black dye layer 350 coated on the transparent protective film 360 and having a preset transmissivity.

If the transparent protective film 360 is exposed to UV rays for a long time, it may cause a problem that transparency is reduced. Particularly, the transparent protective film 360 may include a colorless polyimide (CPI) film and may have a problem of a yellowness effect in case of being exposed to UV rays for a long time.

The black dye layer 350 includes a black dye having a preset transmissivity and may reduce an extent that the transparent protective film 360 is exposed to UV rays. Particularly, the black dye layer 350 may have a transmissivity of 30%. Here, the black dye layer 350 may contain a UV shield agent to increase a UV shield effect.

According to the data shown in FIG. 13, in case that the black dye layer 350 containing a UV shield agent with a transmissivity of 30% is coated on a colorless polyimide (CPI) film, yellowness ΔYI and energy accumulation ΔE are described.

Particularly, FIG. 13(a) shows data when colorless polyimide (CPI) is exposed to UV rays for a preset time without the black dye layer 350. FIG. 13(b) shows data when colorless polyimide (CPI) is exposed to UV rays for a preset time in a state that the black dye layer 350 is coated on a top surface of the CPI.

Referring to FIG. 13(a), after the lapse of 24 hours with reference to a time (0 h) of manufacturing a display device (or module), yellowness of a colorless polyimide (CPI) film proceeds by 0.77 in comparison to the reference time and energy accumulated in the CPI film increases by 0.44. After the lapse of 48 hours from the reference time (0 h), yellowness of the CPI film proceeds by 1.38 in comparison to the reference time and energy accumulated in the CPI film increases by 0.66. Namely, it is confirmed that the yellowness and the energy accumulation increase in proportion to an increasing time.

Referring to FIG. 13(b), after the lapse of 24 hours with reference to a time (0 h) of manufacturing a display device (or module), yellowness of a colorless polyimide (CPI) film proceeds by 0.77 in comparison to the reference time and energy accumulated in the CPI film increases by 0.44. After the lapse of 48 hours from the reference time (0 h), yellowness of the CPI film proceeds by 0.75 in comparison to the reference time and energy accumulated in the CPI film increases by 0.43. Thus, it is confirmed that the data obtained from the lapse of 24 hours and the data obtained from the lapse of 48 hours maintain the same level in error range. Namely, it is confirmed that the colorless polyimide (CPI) has no change in yellowness and energy accumulation at the preset time.

There is no change in yellowness and energy accumulation of CPI since the lapse of a preset time, which may work as an advantageous effect in implementing a continuous single screen in a large-screen display device using display modules. In this regard, FIG. 14 will be referred to.

A display device using display modules may include a frame 400 and a plurality of display modules 300 arranged in the frame 400.

The display modules 300 may configure a large screen in a manner of forming a grid array in the frame 400. Each of the display modules 300 may be a unit module having the stacked structure of FIG. 12. Particularly, the display module 300 may include a base substrate 310 including a circuit wiring, a semiconductor light emitting element 320 connected to the circuit wiring and emitting light in response to an applied voltage, an envelope layer 330 sealing the semiconductor light emitting element 320, a transparent protective film 360 stacked on the envelope layer 330 and having flexibility, and a black dye layer 350 coated on the transparent protective film 360 and having a preset transmissivity.

Here, the black dye layer 350 may include a UV shield agent. A reduced transparency extent between a newly replaced display module 300d and a display module 300c exposed to UV rays over a preset time may be maintained within a preset range by the black dye layer 350. Particularly, if the transparent protective film 360 of the display module 300 is a colorless polyimide (CPI) film, the black dye layer 350 may maintain a yellowness index difference of the CPI film between the display modules 300 within a preset range.

Regarding a flow of time, after the display module 300 (FIG. 14(a)) arranged in the frame 400 has been exposed to UV rays for a predetermined time Δt, a yellowness index may be maintained on the same level [see FIG. 14(b)]. Thereafter, if an error 500 occurs in the semiconductor light emitting element 360, the corresponding display module 300a needs to be replaced entirely [see FIG. 14(c) and FIG. 14(d)]. In this case, the replaced display module 300b and the display module 300c in the assembled state before the replacement may maintain the same yellowness progress state after a preset time. Therefore, it may be advantageous in maintaining the same transparency of the transparent protective film 360 between the display modules 300 configuring a single large screen and implementing a single screen connected neatly.

In case that the black dye layer 350 is externally exposed as it is, there may be a problem that the black dye layer 350 is scratched and peeled off. To prevent such a problem, a display device using a semiconductor may include at least one 370 of an Anti-Reflection (AR) or Anti-Glare (AG) film, a Low Reflection (LR) film and an Anti-Finger (AF) film, which are formed on the black dye layer 350.

The AR film may have a green wavelength band relatively wide among anti-reflective wavelength bands. Namely, regarding wavelength band rates among the anti-reflective wavelength bands, a red or blue wavelength band may be set relatively narrow but a green wavelength band may be set relatively wide.

Figure 15:
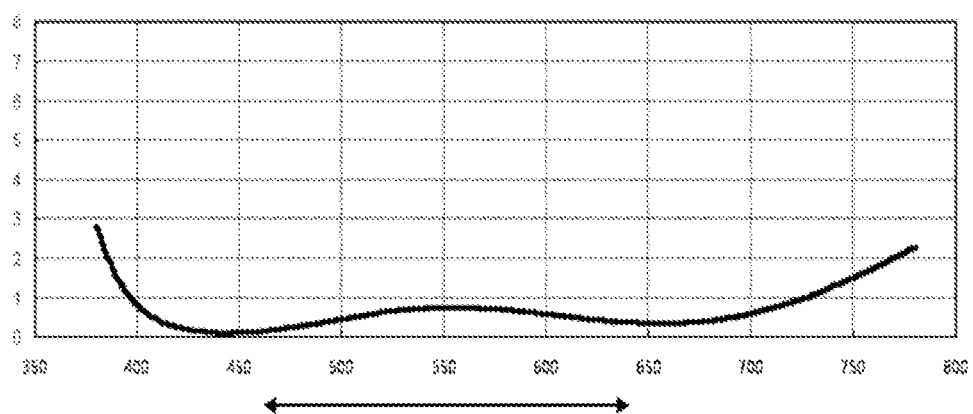
FIG. 15 is a graph showing a reflectance spectrum of an AR film according to one embodiment.

FIG. 15 is a graph showing a reflectance spectrum of an AR film according to one embodiment.

Referring to FIG. 15, it is observed that a green wavelength band is set relatively wide in a reflectance spectrum of an Anti-Reflection (AR) film. As shown in FIG. 15, such a green wavelength band may include a wavelength band of 450~650 nm.

Generally, since an Anti-Reflection (AR) film consists of a multitude of layers and thicknesses of the layers are not uniform completely, there may exist dispersion. Namely, a minute thickness difference may exist in part and a reflectance may differ in part due to such a thickness difference.

Since a variation of a blue or red wavelength reflectance is greater than that of a green wavelength reflectance depending on a lateral view angle, if the red wavelength reflectance is greater, a color change according to a lateral view angle may be detected.

Therefore, since a green wavelength band occupies a more part in an Anti-Reflection Reflection (AR) film, a color change according to a lateral view angle may not be detected. If such a property applies to a module-type display including a multitude of the display modules 300 like the embodiment of the present disclosure, it may have a greater effect.

Furthermore, an Anti-Reflection (AR) film, of which green wavelength band is a main reflective wavelength band may maintain a uniform color without a color change even if a view angle of viewing the display module 300 is changed.

Figure 16:
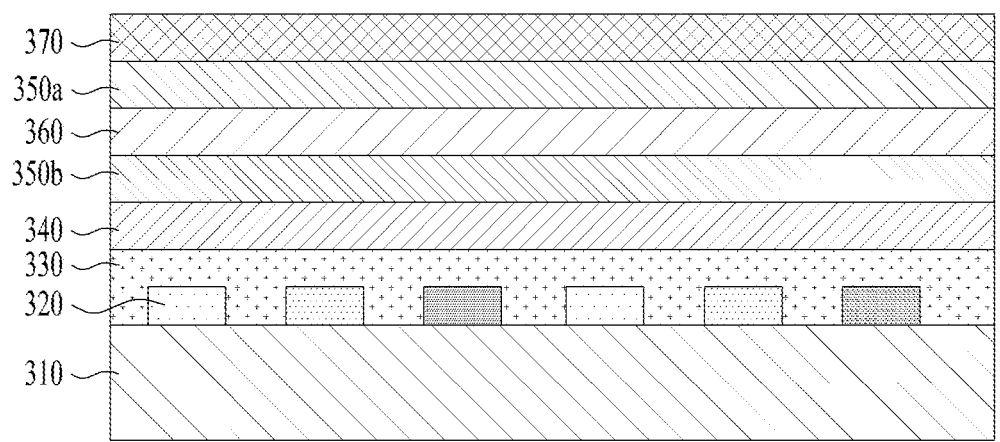
FIG. 16 is a conceptual diagram to describe a stacked e structure of a display device using a semiconductor according to another embodiment, a transparency reduction effect of which is improved.

FIG. 16 is a conceptual diagram to describe a stacked e structure of a display device using a semiconductor according to further embodiment, of which a transparency reduction effect is improved.

According to further embodiment, a display device using a semiconductor may include a base substrate 310 including a circuit wiring, a semiconductor light emitting element 320 connected to a circuit board and emitting light in response to an applied voltage, an envelope layer 330 sealing the semiconductor light emitting element 320, a transparent protective film 360 stacked on the envelope layer 330 and having flexibility, a first black dye layer 350a coated on the transparent protective film 360 and having a preset transmissivity, and a second black dye layer 350b additionally coated on a backside of the transparent protective film 360.

The first black dye layer 350a may contain a UV shield agent and have a transmissivity different from that of the second black dye layer 350b. To raise the UV shield function, the first black dye layer 350a may have the transmissivity lower than that of the second black dye layer 350b.

The second black dye layer 350b performs a function of increasing a contrast range and may be coated in a lattice pattern corresponding to the location of the semiconductor light emitting element 320. Specifically, the second black dye layer 350b may be coated in a lattice pattern by avoiding the area of the semiconductor light emitting element 320 so as not to overlap with the semiconductor light emitting element 320.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

What is claimed is:
1. A display device, comprising:
   a base substrate;
   a plurality of semiconductor light emitting elements on the base substrate and configured to respectively emit light in response to an applied voltage;
   an envelope layer sealing the plurality of semiconductor light emitting elements and planarizing the base substrate on which the plurality of semiconductor light emitting elements are mounted;
   a transparent protective film stacked on the envelope layer and having flexibility; and
   a black dye layer coated on a first side of the transparent protective film and simultaneously overlapped with the plurality of semiconductor light emitting elements, and having a preset transmissivity.
2. The display device of claim 1, wherein the transparent protective film comprises a Colorless Polyimide (CPI) film.
3. The display device of claim 1, wherein the black dye layer comprises a UV shield agent.
4. The display device of claim 1, wherein the black dye layer has transmissivity of 30%.

5. The display device of claim 1, further comprising a black dye layer additionally coated on a second side of the transparent protective film.

6. The display device of claim 5, wherein the black dye layer coated on the first side of the transparent protective film has transmissivity lower than that of the black dye layer coated on the second side of the transparent protective film.

7. The display device of claim 5, wherein the black dye layer coated on the second side of the transparent protective film is coated in a lattice pattern avoiding the plurality of semiconductor light emitting elements so as not to overlap with the plurality of semiconductor light emitting elements.

8. The display device of claim 1, comprising at least one of an Anti-Reflection (AR) or Anti-Glare (AG) film, a Low Reflection (LR) film, or an Anti-Finger (AF) film on the black dye layer.

9. The display device of claim 1, wherein an adjacent pair of the plurality semiconductor light emitting elements are separated by a distance, and
wherein the black dye layer is a sheet simultaneously overlapping the adjacent pair and the distance the adjacent pair.

10. A display device, comprising:
a frame; and
a plurality of display modules arranged in the frame, each of the display modules, comprising:
a base substrate;
a plurality of semiconductor light emitting elements on the base substrate and configured to respectively emit light in response to an applied voltage;
an envelope layer sealing the plurality of semiconductor light emitting elements and planarizing the base substrate on which the plurality of semiconductor light emitting elements are mounted;
a transparent protective film stacked on the envelope layer and having flexibility; and
a black dye layer coated on a first side of the transparent protective film and simultaneously overlapped with the plurality of semiconductor light emitting elements, and configured to have a preset transmissivity and maintain a yellowness index of the transparent protective film between the adjacent display modules within a preset range.

11. The display device of claim 10, wherein the transparent protective film comprises a Colorless Polyimide (CPI) film.

12. The display device of claim 10, wherein the black dye layer comprises a UV shield agent.

13. The display device of claim 10, wherein the black dye layer maintains the yellowness index of the transparent protective film between the display module exposed to UV rays over a preset time and the display module newly manufactured within the preset range.

14. The display device of claim 10, wherein the black dye layer has transmissivity of 30%.

15. The display device of claim 10, further comprising a black dye layer additionally coated on a second side of the transparent protective film.

16. The display device of claim 15, wherein the black dye layer coated on the first side of the transparent protective film has transmissivity lower than that of the black dye layer coated on the second side of the transparent protective film.

17. The display device of claim 15, wherein the black dye layer coated on the second side of the transparent protective film is coated in a lattice pattern avoiding the plurality of semiconductor light emitting elements so as not to overlap with the plurality of semiconductor light emitting elements.

18. The display device of claim 10, wherein the display module comprises at least one of an Anti-Reflection (AR) or Anti-Glare (AG) film, a Low Reflection (LR) film, or an Anti-Finger (AF) film on the black dye layer.

19. The display device of claim 10, wherein an adjacent pair of the plurality semiconductor light emitting elements are separated by a distance, and
wherein the black dye layer is a sheet simultaneously overlapping the adjacent pair and the distance the adjacent pair.

20. A display device, comprising:
a base substrate;
a semiconductor light emitting element on the base substrate and configured to emit light in response to an applied voltage;
an envelope layer sealing the semiconductor light emitting element;
a transparent protective film stacked on the envelope layer and having flexibility;
a black dye layer coated on a first side of the transparent protective film and having a preset transmissivity; and
a black dye layer additionally coated on a second side of the transparent protective film.

* * * * *